United States Patent
Gross, Jr. et al.

[11] Patent Number: 5,619,203
[45] Date of Patent: Apr. 8, 1997

[54] CURRENT SOURCE DRIVEN CONVERTER

[75] Inventors: George F. Gross, Jr., Reading; Thayamkulangara R. Viswanathan, Albany Township, Berks County, both of Pa.

[73] Assignee: Lucent Technologies Inc., Murray Hill, N.J.

[21] Appl. No.: 327,162

[22] Filed: Oct. 21, 1994

[51] Int. Cl.$^6$ ............................ H03M 1/68; H03K 13/00
[52] U.S. Cl. ................................ 341/144; 341/145
[58] Field of Search ....................... 341/144, 145

[56] References Cited

U.S. PATENT DOCUMENTS

| | | | |
|---|---|---|---|
| 3,611,353 | 10/1971 | Shipp et al. | 340/347 DA |
| 3,997,892 | 12/1976 | Susset | 340/347 |
| 4,034,366 | 7/1977 | Memishian, Jr. | 340/347 AD |
| 4,198,622 | 4/1980 | Connolly, Jr. et al. | 340/347 |
| 4,263,664 | 4/1981 | Owen et al. | 365/185 |
| 4,281,319 | 7/1981 | Roberts, Jr. | 340/347 |
| 4,292,625 | 9/1981 | Schoeff | 340/347 DA |
| 4,293,848 | 10/1981 | Cheng | 340/347 |
| 4,393,370 | 7/1983 | Hareyama | 340/347 DA |
| 4,520,461 | 5/1985 | Simko | 365/184 |
| 4,617,652 | 10/1986 | Simko | 365/203 |
| 4,668,932 | 5/1987 | Drori et al. | 338/48 |
| 4,764,750 | 8/1988 | Kawada | 340/347 AD |
| 4,896,157 | 1/1990 | Mijuskovic | 341/144 |
| 4,904,922 | 2/1990 | Colles | 323/316 |
| 4,973,979 | 11/1990 | Ikeda | 341/154 |
| 4,983,974 | 1/1991 | Mijuskovic | 341/156 |
| 5,010,337 | 4/1991 | Hisano et al. | 341/154 |
| 5,014,054 | 5/1991 | Oshita et al. | 341/145 |
| 5,016,014 | 5/1991 | Bitting | 341/162 |
| 5,036,322 | 7/1991 | Barrow et al. | 341/144 |
| 5,039,747 | 8/1991 | Piejko et al. | 525/197 |
| 5,049,882 | 9/1991 | Gorceki et al. | 341/143 |
| 5,059,978 | 10/1991 | Valdenaire | 341/145 |
| 5,181,034 | 4/1992 | Takakura et al. | 341/144 |
| 5,243,347 | 9/1993 | Jackson et al. | 341/144 |
| 5,489,904 | 2/1996 | Hadidi | 341/156 |
| 5,495,245 | 2/1996 | Ashe | 341/145 |

FOREIGN PATENT DOCUMENTS

| | | | |
|---|---|---|---|
| 0123222 | 10/1984 | European Pat. Off. | H03K 13/05 |
| 0152930 | 8/1985 | European Pat. Off. | H03M 1/68 |

OTHER PUBLICATIONS

Patent Abstracts of Japan, vol. 014, No. 108 (E–0896), 27 Feb., 1990.

*Primary Examiner*—Jeffrey A. Gaffin
*Assistant Examiner*—Peguy JeanPierre
*Attorney, Agent, or Firm*—David L. Smith

[57] ABSTRACT

There is disclosed an integrated circuit that includes a digital-to-analog converter having a resistor string driven by a current source. The resistor string is coupled to the current source. Intermediate taps are defined at the resistor junctions as well the resistor-current source junctions. Switching transistors are coupled between an output node and a respective intermediate tap. A selection circuit is coupled to a terminal of each switching transistor for selectively switching the transistors to a predetermined state to electrically couple the associated intermediate tap to the output node.

16 Claims, 4 Drawing Sheets

CURRENT SOURCE DRIVEN CONVERTER

TECHNICAL FIELD

This invention relates generally to digital-to-analog converters (DACs), and more particularly to such converters driven by a current source.

BACKGROUND OF THE INVENTION

DACs are used to convert a digitally coded signal to an analog signal, or in conjunction with successive approximation circuitry as part of an analog-to-digital converter. DACs may employ a voltage applied across a resistor string. Switches, such as transistors, couple intermediate taps at the resistor junctions, as well as at the resistor-potential junctions, to an output node. The digitally coded signal is decoded to determine which switch to turn on. The magnitude of an analog voltage produced at the output node depends on which switch is turned on. Precisely generating an analog voltage that corresponds to a digitally coded signal necessitates the resistors of the resistance string have identical resistances. Even with identical resistances in the resistor string, the analog voltage at the output node can be inaccurate because any noise voltage induced in series with the reference voltage source of a voltage driven resistor string DAC changes the voltage across each resistor in the resistor string, and thus the voltage at each intermediate tap. The noise voltage at each intermediate tap is not the same, resulting in an erroneous analog voltage being produced at the output node.

SUMMARY OF THE INVENTION

In accordance with an illustrative embodiment of the present invention, an integrated circuit includes a digital-to-analog converter in which a resistor string is driven by a current source. Intermediate taps are defined at the resistor junctions as well the resistor-current source junctions. Switching transistors are coupled between an output node and respective intermediate taps. A selection circuit is coupled to a terminal of each switching transistor for selectively switching the transistors to a predetermined state to electrically couple the associated intermediate tap to the output node.

DETAILED DESCRIPTION

Figure 1:
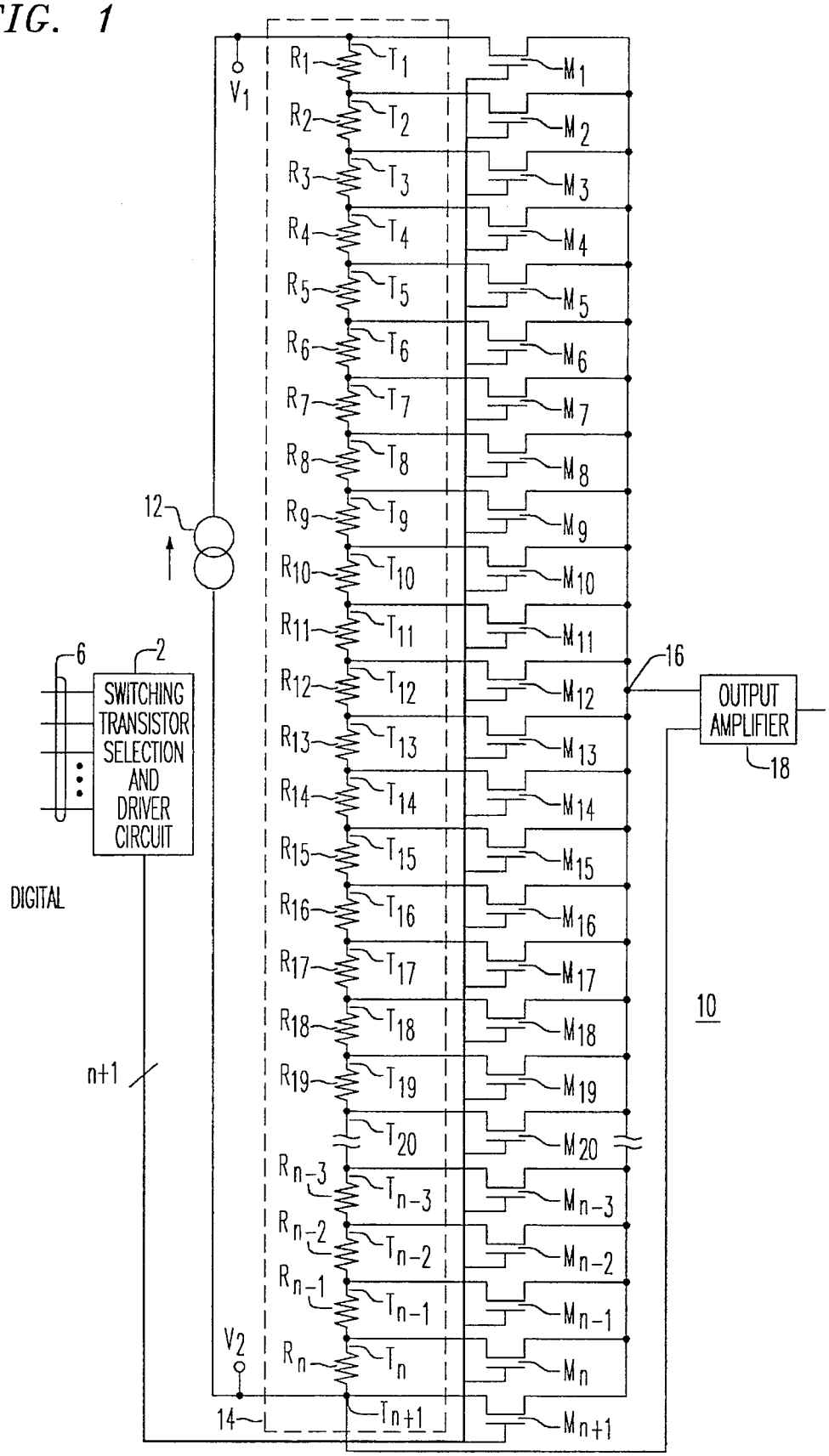
FIG. 1 is a schematic diagram of a single-ended mode digital-to-analog converter in accordance with an illustrative embodiment of the present invention.

The schematic diagram of a DAC 10 in accordance with an illustrative embodiment of the present invention is shown in FIG. 1. DAC 10 is shown operating in a single-ended mode. DAC 10 includes a current source coupled to a resistor string to provide a constant current to the resistor string. Switches, shown as MOS transistors, couple intermediate taps to a common output node. The magnitude of an analog voltage produced at the output node depends on which switch or switches are turned on. The output may be amplified by an output amplifier. A DAC in accordance with the present invention is suitable for fabrication in the form of a monolithic integrated circuit.

Resistor string 14 is comprised of a user-determined number, n, of resistors in series, denoted $R_1$ through $R_n$. The resistor string is coupled to a current source 12 which, when DAC 10 is employed as a digital-to-analog converter, provides a known constant current to resistor string 14. The resistance values of the resistors comprising the resistor string are application dependent and can be readily selected by one skilled in the art based on a variety of parameters such as the power to be dissipated, the potential across the resistor string, and the number of resistors in the resistor string. At the resistor junctions, as well as at the current source-resistor junctions, a switch is coupled between the junction and output node 16. The junctions define intermediate taps $T_1$ through $T_{n+1}$. The switches, preferably transistors, are shown in the illustrative embodiment as MOS transistors $M_1$ through $M_{n+1}$.

Transistor $M_1$ is coupled between the junction of the positive terminal of current source 12 and resistor $R_1$, and output node 16. Transistor $M_{n+1}$ is coupled between the junction of the negative terminal of current source 12 and resistor $R_n$, and output node 16. Transistors $M_2$ through $M_n$ each couple an intermediate tap, $T_2$ through $T_n$ respectively, with output node 16. The transistors are typically identical and have an impedance in the conductive state that is very large compared to the resistance of resistors in resistor string 14. Output amplifier 18 amplifies the output signal at output node 16 and may convert the output to another form, such as from a voltage output to a current output.

As is known in the digital-to-analog converter art, a digitally encoded signal 6, representative of the desired analog signal, is provided to a decode circuit. The decode circuit decodes the digitally encoded signal and a driver circuit turns on the appropriate switch or switches to conduct the voltage at the associated intermediate tap(s) to the output node. A single switch may be turned on, or multiple switches may be switched to be in the on state simultaneously. Switching transistors $M_1$ through $M_{n+1}$ are controlled by switching transistor selection and driver circuit 2. A monotonic input-output characteristic, providing a staircase output voltage at output node 16 for increasing digitally encoded inputs 6 is derived from the intermediate taps $T_1$ through $T_{n+1}$.

In accordance with the present invention, current source 12 provides a constant current to resistor string 14. One or more of transistors $M_1$ through $M_{n+1}$ is switched on to couple respective ones of the intermediate taps to output node 16. By selectively switching on transistors $M_1$ through $M_{n+1}$, the voltage in resistor string 14 at the associated intermediate tap is provided at output node 16. Voltages intermediate the voltages at the intermediate taps may be provided at output node 16 by selectively switching on multiple ones of transistors $M_1$ through $M_{n+1}$.

Any noise voltage, induced in the current source-resistor string loop does not alter the current because of the high impedance inherent in current source 12. Since the voltage produced at output node 16 depends only on the current passing through resistor string 14 and the resistance of the resistors in resistor string 14, the accuracy of the voltage produced at output node 16 is immune to such a noise voltage.

Figure 2:
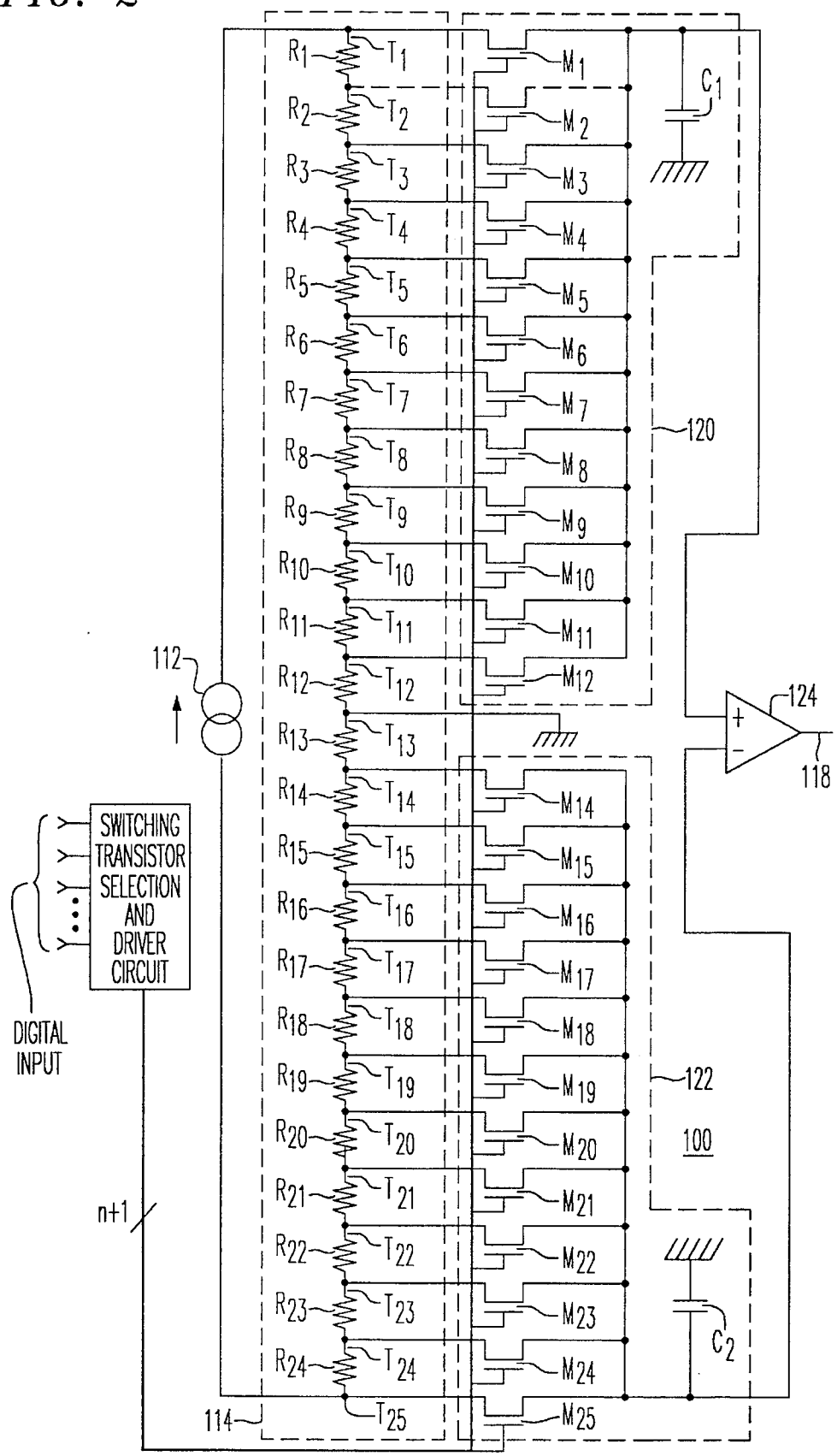
FIG. 2 is a schematic diagram of a differential mode digital-to-analog converter in accordance with an illustrative embodiment of the invention.

The current driven DAC can also be operated in a differential mode. A differential mode DAC 100 is illustrated in the schematic diagram of FIG. 2. Resistor string 114 illustratively has twenty four resistors, thereby defining twenty five intermediate taps, $T_1$ through $T_{25}$. The middle intermediate tap is coupled to a reference potential, such as ground. Absent noise and with a constant current provided by current source 112, intermediate taps $T_1$ through $T_{12}$ operate at a positive voltage, intermediate tap $T_{13}$ is maintained at ground potential, and intermediate taps $T_{14}$ through $T_{25}$ operate at a negative voltage. To provide an analog output voltage at output 118, switching transistors are turned on symmetrically about the intermediate tap coupled to a reference voltage. Whereas with DAC 10, a single switching transistor may be turned on to provide an analog output voltage, with DAC 100 transistors are turned on in pairs symmetrically about the intermediate tap coupled to the reference voltage. For example, if transistor $M_6$ is turned on, transistor $M_{20}$ is also turned on. If transistors $M_2$ and $M_3$ are turned on to provide an analog output voltage at output 118, transistors $M_{24}$ and $M_{23}$ are also turned on. Multiple transistors on both the positive and negative voltage sides of resistor string 114 of differential mode DAC 100 can be turned on in accordance with the teaching of U.S. Patent Application Ser. No. 08/327,174 entitled "Digital-To-Analog Converter With Reduced Number Of Resistors And Method Of Using," filed concurrently herewith and hereby incorporated by reference.

Turning on one or more transistors $M_1$ through $M_{12}$ operating on the positive voltage side of resistor string 14, charges capacitor C1. Similarly, turning on one or more transistors $M_{14}$ through $M_{25}$ operating on the negative voltage side of resistor string 114 charges capacitor C2. When the charging of the capacitor is complete, the currents in the switches go to zero. Thus the voltage drops across each switch also go to zero. The DAC operation is not affected by the switch resistance or switch nonlinearity. It is thus important that the switches remain closed until the current decreases to zero for operation of the DAC.

Figure 3:
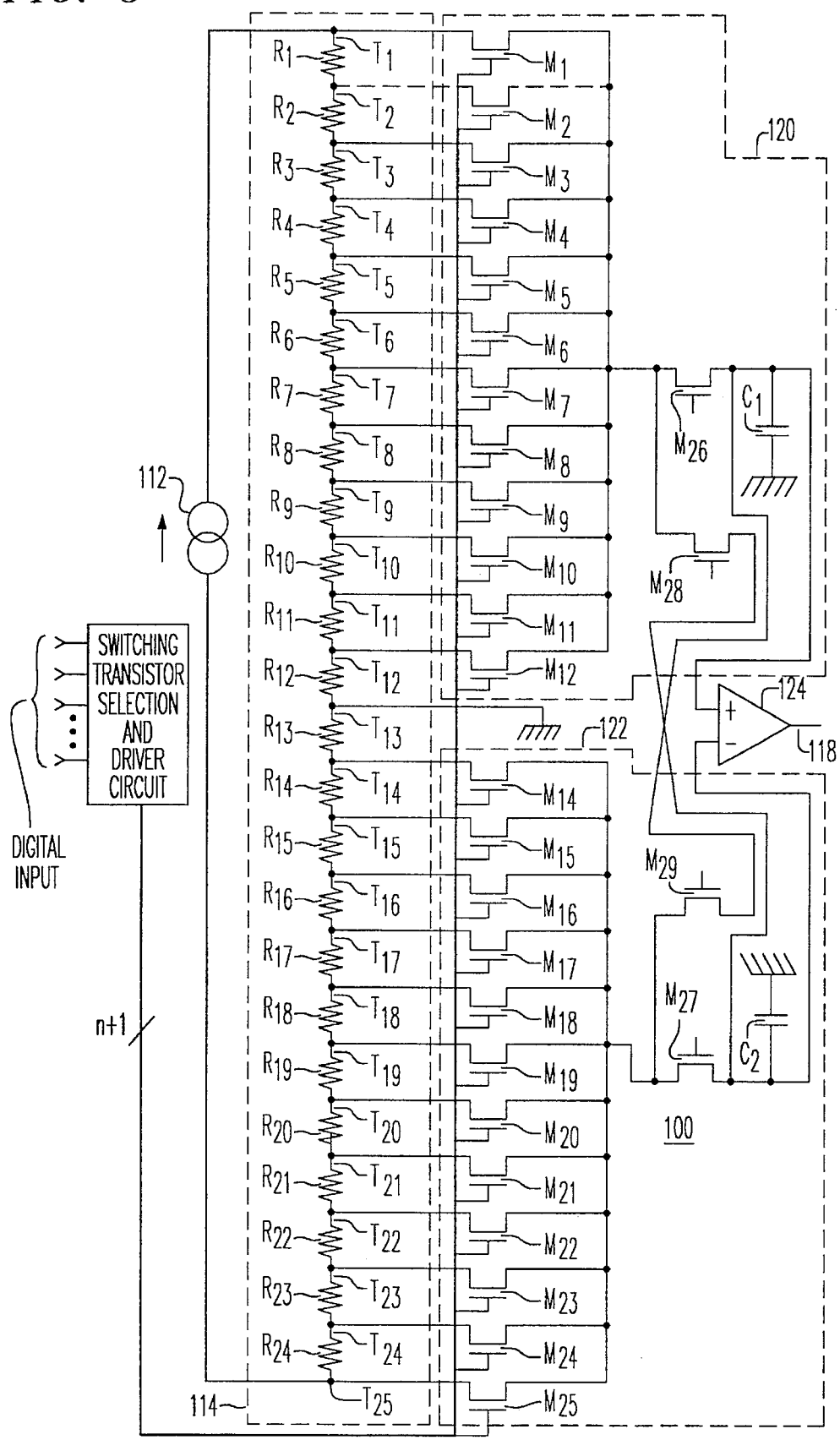
FIG. 3 is a schematic diagram of a differential mode digital-to-analog converter capable of achieving an additional bit of precision.

The switching transistor on the positive voltage side of resistor string 114 in conjunction with capacitor C1 form sample and hold circuit 120. The switching transistors on the negative voltage side of resistor string 114 in conjunction with capacitor C2 form sample and hold circuit 122. The capacitor voltages provide the positive and negative inputs to differential amplifier 124. The capacitor voltages are added by differential amplifier 124 to reject any common mode noise, resulting in a noise-immune analog output voltage at output 118 of differential amplifier 124, FIG. 3 shows a schematic circuit of a DAC 110 capable of converting a digitally encoded input having an additional bit to an analog output using the same number of resistors in the resistor string and number of switches coupled to the intermediate taps as in the embodiment shown in FIG. 2. DAC 110 permits the digitally encoded signal to have one more bit than DAC 100 and produces twice the number of discrete analog outputs, with the analog outputs extending over both a positive and negative range. Typically, the midpoint of the range of digitally encoded inputs corresponds to the zero analog output. Other techniques can also be used to convert the entire range of digitally encoded inputs to outputs. Two levels of decoding are employed. The least significant bits are decoded to produce the magnitude of the signal. The most significant bit is decoded in a second stage to determine which resistor signal is coupled to which capacitor.

Figure 4:
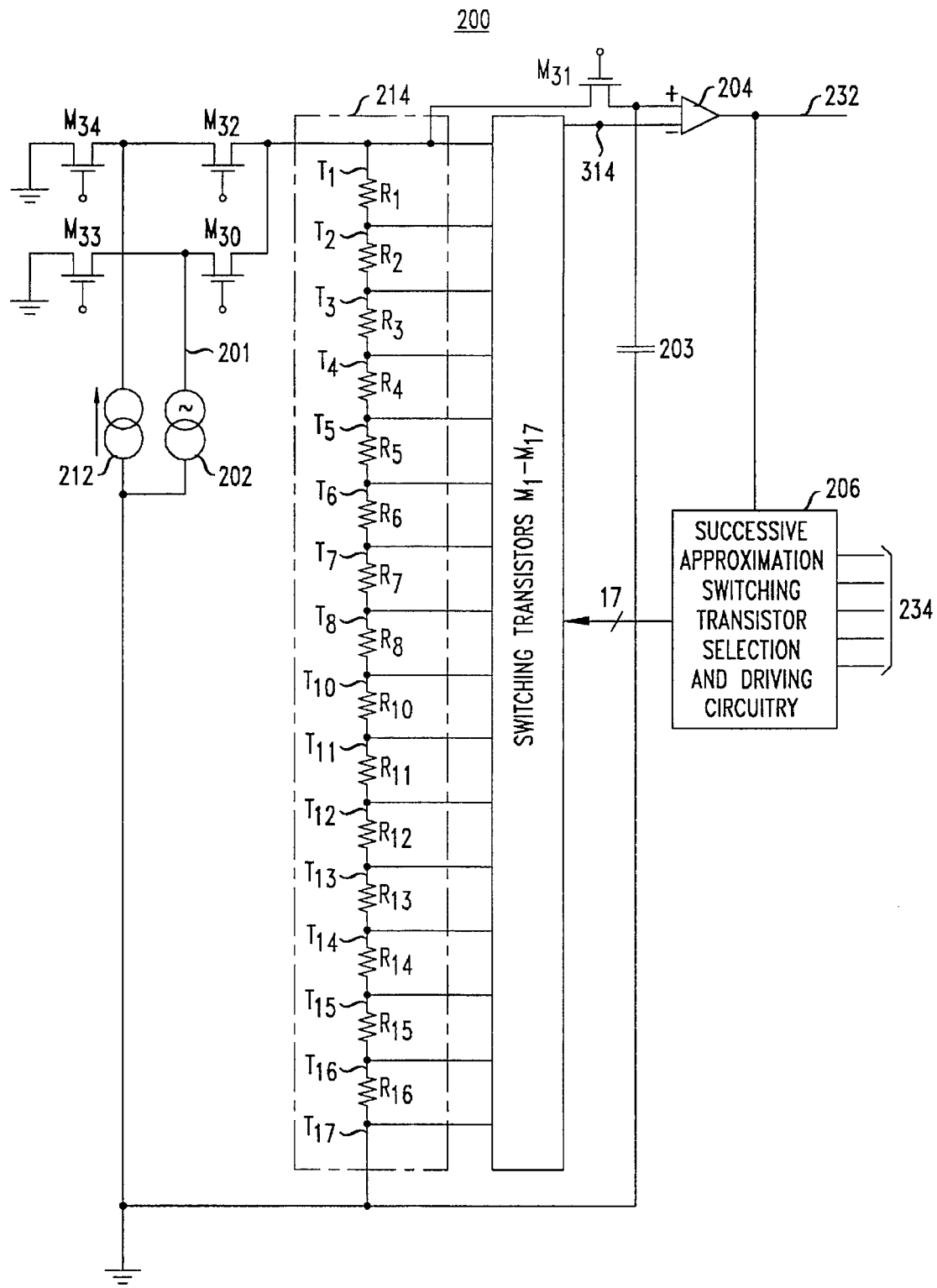
FIG. 4 is a schematic diagram of an analog-to-digital converter.

An analog-to-digital converter 200, incorporating a digital-to-analog converter in accordance with the illustrative embodiment of the invention, is shown in FIG. 4. The analog-to-digital converter converts an analog current signal to a corresponding digitally encoded signal. Switching transistors $M_1$ through $M_{17}$ may be configured as disclosed above or in any known configuration. The analog-to-digital conversion is completed in a two step sequence. In the first step, the analog current is passed through the resistor string to generate a voltage. The voltage developed across the entire resistor string is held by a sample-and-hold circuit. In the second step, successive approximation circuitry generates a series of intermediate tap voltages with each iteration that more closely approximates the voltage maintained by the sample-and-hold circuit. The successive approximation process continues until the digital equivalent of the voltage held by the sample-and-hold circuit is determined.

In analog-to-digital converter 200, an analog current signal 202 is received on line 201 with transistors $M_{30}$, $M_{31}$, and $M_{34}$ switched to be in the on state and transistors $M_{32}$ and $M_{33}$ switched to be in the off state. Transistor $M_{34}$ being on dumps the current produced by current source 212 to ground. The voltage developed across resistor string 2 14 charges capacitor 203 and provides the positive input to comparator 204. Transistors $M_{30}$, $M_{31}$, and $M_{34}$ are then switched to be in the off state and transistors $M_{32}$ and $M_{33}$ are switched to be in the on state. Transistor $M_{33}$ being on dumps analog current signal 202 to ground. Transistors $M_{30}$, $M_{31}$, $M_{32}$, $M_{33}$, and $M_{34}$ together with capacitor 203 comprise a sample-and-hold circuit that maintains the voltage developed across resistor sting 214 as the positive input to comparator 204. Successive approximation circuitry 206 initially turns on the appropriate switching transistor or transistors $M_1$ through $M_{17}$ to produce the midpoint voltage of resistor string 214 at output node 3 14. The voltage at output node 3 14 provides the negative input to comparator 204 where it is compared to the voltage maintained on capacitor 203. If output 232 from comparator 204, representing the difference between the voltage maintained on capacitor 203 and the voltage generated at output node 3 14 by the current successive approximation iteration is positive, the midpoint of the upper half of the resistor string 214 is electrically coupled as the input to comparator 204 and compared to the voltage maintained on capacitor 203. If the output 232 is negative, the midpoint of the lower half of the resistor string 2 14 is electrically coupled as the input to comparator 204. The selection of the switching transistor or transistors that are switched on, as described above, are controlled by successive approximation circuitry 206. Starting with a default bit pattern, each iteration determines one bit in the binary, or other coded, representation 234, and the successive approximation process continues until all bits are determined. The successive approximation process is known to those skilled in the art and may be implemented as described above or in any known manner. The binary representation 234 is provided as the output of successive approximation circuitry 206 and analog-to-digital converter 200.

The invention is particularly useful in communication systems and equipment employing integrated circuits in digital-to-analog and analog-to-digital converter applications. Such communication systems and equipment have the advantage of being more immune to noise induced in the resistor string of converters.

While the analog-to-digital converter shown in FIG. 4 is shown as operating in the single-ended mode, those skilled in the art could fabricate an analog-to-digital converter that operates in the differential mode.

We claim:

1. An integrated circuit for providing an analog output, comprising:

a current source having a positive terminal and a negative terminal;

a resistor string coupled across the positive and negative terminals of the current source, the resistor string comprising a plurality of serially coupled resistors and providing a current path;

intermediate taps defined at the junctions of resistors in the resistor string, one of the intermediate taps coupled to a reference potential, said one intermediate tap dividing the other intermediate taps into a first group of intermediate taps between said one intermediate tap and the positive terminal of the current source and a second group of intermediate taps between said one intermediate tap and the negative terminal of the current source;

a first plurality of switching transistors coupled between a first node and a respective intermediate tap of the first group;

a second plurality of switching transistors coupled between a second output node and a respective intermediate tap of the second group;

a selection circuit coupled to a terminal of each switching transistor in the first and second plurality of switching transistors, the selection circuit for switching the state of selected ones of the transistors to a predetermined state in response to a digitally encoded signal, the selection circuit capable of switching at least two switching transistors to be in the predetermined state simultaneously; and a differential amplifier having first and second input ports and an output port, the first input port of the differential amplifier coupled to the first output node to receive a signal therefrom, the second input port of the differential amplifier coupled to the second output node to receive a signal therefrom, the differential amplifier providing a signal at its output port that is the difference between the signals received at its first and second input ports, whereby common mode noise is rejected from an analog signal produced at the output of the differential amplifier.

2. An integrated circuit as recited in claim 1, wherein one of said at least two switching transistors is in the first plurality of switching transistors and another of said at least two switching transistors is in the second plurality of switching transistors.

3. An integrated circuit including an analog-to-digital converter for generating a digital representation of an analog current signal, comprising:

a current source having a first terminal and a second terminal;

a resistor string providing a current path, the resistor string comprising a plurality of serially coupled resistors;

intermediate taps defined at the junctions of resistors in the resistor string;

a plurality of switching transistors, each of the switching transistors coupled between an output node and a respective intermediate tap;

a comparator having first and second input leads and an output port, the first input lead coupled to the output node to receive the generated analog signal, the second input lead coupled to receive the analog signal, the comparator providing a difference signal at its output port that is the difference between the signals received at its first and second input leads; and a successive approximation switching transistor selection and driving circuit, the successive approximation circuit receiving the difference signal output from the comparator, the successive approximation circuit coupled to a terminal of each of the plurality of switching transistors for selectively switching the switching transistors to a predetermined state, to produce the generated analog signal when the resistor string is energized by an energy source, the successive approximation circuit successively approximating the analog signal and producing a digital representation thereof as an output.

4. An integrated circuit as recited in claim 3, wherein the converter operates in a single-ended mode.

5. An integrated circuit including a digital-to-analog converter for providing an analog output at an output node, comprising:

a current source having a first terminal and a second terminal;

a resistor string coupled across the first and second terminals of the current source, the resistor string comprising a plurality of serially coupled resistors and providing a current path;

intermediate taps defined at the junctions of resistors in the resistor string;

a plurality of switches, each of the switches coupled between the output node and a respective intermediate tap; and a selection circuit coupled to each switch for selectively switching the switches to a predetermined state, at least two switches capable of being switched to be in the predetermined state simultaneously whereby an intermediate tap is coupled to the output node when the corresponding switch is switched to the predetermined state.

6. An integrated circuit for providing an analog output, comprising:

a current source having a first terminal and a second terminal;

a resistor string coupled across the first and second terminals of the current source, the resistor string comprising a plurality of serially coupled resistors and providing a current path;

intermediate taps defined at the junctions of resistors in the resistor string, one of the intermediate taps coupled to a reference potential, said one intermediate tap dividing the other intermediate taps into a first group of intermediate taps between said one intermediate tap and the first terminal of the current source and a second group of intermediate taps between said one intermediate tap and the second terminal of the current source;

a first plurality of switches coupled between a first node and a respective intermediate tap of the first group;

a second plurality of switches coupled between a second output node and a respective intermediate tap of the second group;

a selection circuit coupled to each switch in the first and second plurality of switches, the selection circuit for switching the state of selected ones of the switches to a predetermined state in response to a digitally encoded signal, the selection circuit capable of switching at least two switches to be in the predetermined state simultaneously; and a differential amplifier having first and second input ports and an output port, the first input port of the differential amplifier coupled to the first output node to receive a signal therefrom, the second input port of the differential amplifier coupled to the second output node to receive a signal therefrom, the differential amplifier providing a signal at its output port that is the difference between the signals received at its first and second input ports, whereby rejected from an analog signal produced at the output of the differential amplifier.

7. An integrated circuit as recited in claim 6, wherein one of said at least two switches is in the first plurality of switches and another of said at least two switches is in the second plurality of switches.

8. An integrated circuit including an analog-to-digital converter for generating a digital representation of an analog current signal, comprising;
   a current source having a first terminal and a second terminal;
   a resistor string providing a current path, the resistor string comprising a plurality of serially coupled resistors;
   a sample-and-hold circuit for coupling the analog current signal to the resistor string and for holding a voltage developed across the resistor string, the sample and hold circuit for removing the analog current signal from the resistor string and coupling the current source thereto;
   intermediate taps defined at the junctions of resistors in the resistor string;
   a plurality of switches, each of the switches coupled between an output node and a respective intermediate tap;
   a comparator having first and second input leads and an output port, the first input lead coupled to the output node to receive the generated analog signal, the second input lead coupled to receive the analog signal, the comparator providing a difference signal at its output port that is the difference between the signals received at its first and second input leads; and
   a successive approximation switch selection and driving circuit, the successive approximation circuit receiving the difference signal output from the comparator, the successive approximation circuit coupled to each of the plurality of switches for selectively switching the switches to a predetermined state, to produce the generated analog signal when the resistor string is energized by a current source, the successive approximation circuit successively approximating the analog signal and producing a digital representation thereof as an output.

9. An integrated circuit as recited in claim 8, wherein the converter operates in a single-ended mode.

10. An integrated circuit as recited in claim 8, wherein at least one of the switches is comprised of a transistor.

11. An integrated circuit as recited in claim 8, wherein juncture of the first terminal of the current source and the resistor string comprises an intermediate tap.

12. An integrated circuit as recited in claim 8, wherein juncture of the second terminal of the current source and the resistor string comprises an intermediate tap.

13. An integrated circuit including an analog-to-digital converter for generating a digital representation of an analog current signal, comprising:
   a resistor string providing a current path, the resistor string comprising a plurality of serially coupled resistors and defining nodes;
   a sample-and-hold circuit for coupling the analog current signal to the resistor string and for holding a voltage developed across the resistor string, the sample-and-hold circuit for removing the analog current signal from the resistor string and coupling a current source thereto to develop respective node voltages at said nodes;
   a comparison circuit for receiving the sample-and-hold voltage developed across the resistor string as a first input, and a node voltage as a second input, the comparison circuit for generating an output that is the difference between the first and second inputs;
   a circuit for converting the comparison circuit output to a digital representation approximating the analog current signal.

14. An integrated circuit as recited in claim 13, wherein the circuit for converting the comparison circuit output to a digital representation approximating the analog current signal comprises a successive approximation circuit.

15. An integrated circuit as recited in claim 13, wherein the converter operates in a single-ended mode.

16. An integrated circuit as recited in claim 13, wherein the converter operates in a differential mode.

* * * * *